(12) United States Patent
Shang et al.

(10) Patent No.: US 8,199,870 B2
(45) Date of Patent: Jun. 12, 2012

(54) SHIFT REGISTER UNIT AND GATE DRIVE DEVICE FOR LIQUID CRYSTAL DISPLAY

(75) Inventors: Guangliang Shang, Beijing (CN); Seung Woo Han, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/875,556

(22) Filed: Sep. 3, 2010

(65) Prior Publication Data

US 2011/0058640 A1 Mar. 10, 2011

(30) Foreign Application Priority Data

Sep. 4, 2009 (CN) .......................... 2009 1 0092003

(51) Int. Cl.
*G11C 19/00* (2006.01)
(52) U.S. Cl. ................. 377/64; 377/68; 377/78; 377/79
(58) Field of Classification Search .......................... None
See application file for complete search history.

(56) References Cited

U.S. PATENT DOCUMENTS

| 7,664,218 B2* | 2/2010 | Tobita .............................. 377/64 |
| 7,778,379 B2* | 8/2010 | Liao et al. ........................ 377/64 |
| 7,817,130 B2* | 10/2010 | Wei et al. ....................... 345/100 |
| 7,899,148 B2* | 3/2011 | Kang et al. ....................... 377/64 |
| 7,911,436 B2* | 3/2011 | Lee et al. ....................... 345/100 |
| 7,932,887 B2* | 4/2011 | Kim et al. ....................... 345/100 |
| 2010/0158188 A1* | 6/2010 | Lee et al. ......................... 377/79 |

* cited by examiner

*Primary Examiner* — Tuan T Lam
(74) *Attorney, Agent, or Firm* — Ladas & Parry LLP

(57) ABSTRACT

An embodiment of the present invention discloses a shift register unit and a gate drive device for a liquid crystal display. The shift register unit, on the basis of a structure of 12 transistors and 1 capacitor in the prior art, enables both the drain of the seventh thin film transistor and the gate and the drain of the ninth thin film transistor being connected to the second clock signal input terminal, such that a leakage current would not be generated among the seventh thin film transistor, the eighth thin film transistor, the ninth thin film transistor and the tenth thin film transistor when a high level signal is outputted from the shift register unit, thus power consumption of the shift register unit may be reduced.

12 Claims, 6 Drawing Sheets

US 8,199,870 B2

SHIFT REGISTER UNIT AND GATE DRIVE DEVICE FOR LIQUID CRYSTAL DISPLAY

BACKGROUND

The embodiments of the present invention relate to a drive technology for a liquid crystal display, to a shift register unit and a gate drive device for the liquid crystal display.

FIG. 1a illustrates a schematic diagram of a structure of the shift register unit in the prior art, and FIG. 1b illustrates a timing chart of shift register unit of FIG. 1a. The shift register unit comprises a first thin film transistor T1, a second thin film transistor T2, a third thin film transistor T3, a fourth thin film transistor T4, a fifth thin film transistor T5, a sixth thin film transistor T6, a seventh thin film transistor T7, a eighth thin film transistor T8, a ninth thin film transistor T9, a tenth thin film transistor T10, an eleventh thin film transistor T11 and a twelfth thin film transistor T12, and also comprises a capacitor C1. A signal input terminal(INPUT-1) inputs a signal (INPUT), a first clock signal input terminal(CLKIN) inputs a first clock signal(CLK), a second clock signal input terminal (CLKBIN) inputs a second clock signal(CLKB), a low voltage signal input terminal(VSSIN) inputs a low voltage signal (VSS), a reset signal input terminal(RESETIN) inputs a reset signal(RESET), and a signal output terminal (OUT) outputs a gate drive signal(OUTPUT). The convergence point for a source of the first thin film transistor T1, a drain of the second thin film transistor T2, a gate of the tenth thin film transistor T10 and the capacitor C1 is PU node, the convergence point for a gate of the fifth thin film transistor T5, a gate of the sixth thin film transistor T6, a drain of the eighth thin film transistor T8 and a source of the seventh thin film transistor T7 is PD node, and the convergence point for a source of the ninth thin film transistor T9, a drain of the tenth thin film transistor T10 and a gate of the seventh thin film transistor T7 is PD_CN node.

As seen from FIG. 1b, when the gate drive signal(OUTPUT) is at low level, even if the first clock signal(CLK) or the second clock signal(CLKB) is at high level, the gate drive signal(OUTPUT) and the signal at PU node can maintain at low level. When the gate drive signal(OUTPUT) is at high level, the first clock signal(CLK) and the signal at PU node are both at high level. The level of the signal at PU node is particularly high due to the coupling effect of capacitor C1, the ninth thin film transistor T9 and the tenth thin film transistor T10 are turned on at same time, which forms a larger leakage current, thereby causing the power consumption of the shift register unit to increase, eventually causing the power consumption increase of the liquid crystal display using said shift register unit.

SUMMARY

The embodiments of the present invention provide a shift register unit and a gate drive device for the liquid crystal display, which are capable of reducing the power consumption of the shift register unit, so as to reduce the power consumption of the gate drive device for the liquid crystal display.

To achieve said aim, an embodiment of the present invention provides a shift register unit, comprising:

a first thin film transistor, a drain and a gate of which are both connected to a signal input terminal;

a second thin film transistor, a drain of which is connected to the source of the first thin film transistor, a gate of which is connected to a reset signal input terminal, and a source of which is connected to a low voltage signal input terminal;

a third thin film transistor, a drain of which is connected to a first clock signal input terminal, a gate of which is connected to the source of the first thin film transistor, and a source of which is connected to a signal output terminal;

a fourth thin film transistor, a drain of which is connected to the source of the third thin film transistor, a gate of which is connected to the reset signal input terminal, and a source of which is connected to the low voltage signal input terminal;

a fifth thin film transistor, a drain of which is connected to the source of the first thin film transistor, and a source of which is connected to the low voltage signal input terminal;

a sixth thin film transistor, a drain of which is connected to the source of the third thin film transistor, and a source of which is connected to the low voltage signal input terminal;

a seventh thin film transistor, a drain of which is connected to a second clock signal input terminal, and a source of which is connected to the gate of the fifth thin film transistor and the gate of the sixth thin film transistor respectively;

a eighth thin film transistor, a drain of which is connected to the source of the seventh thin film transistor, a gate of which is connected to the source of the first thin film transistor, and a source of which is connected to the low voltage signal input terminal;

a ninth thin film transistor, a drain and a gate of which are both connected to the second clock signal input terminal, and a source of which is connected to the gate of the seventh thin film transistor; and a tenth thin film transistor, a drain of which is connected to the source of the ninth thin film transistor, a gate of which is connected to the source of the first thin film transistor, and a source of which is connected to the low voltage signal input terminal.

Another embodiment of the present invention also provides a gate drive device for liquid crystal display, comprising a plurality of aforementioned shift register units deposited on an array substrate of the liquid crystal display;

wherein except for the first shift register unit and the last shift register unit, the signal output terminal of each shift register unit is connected to the signal input terminal of a next adjacent shift register unit and the reset signal input terminal of a previous adjacent shift register unit, the signal output terminal of the first shift register unit is connected to the signal input terminal of the second shift register unit, the signal output terminal of the last shift register unit is connected to the reset signal input terminal of a previous adjacent shift register unit and the reset signal input terminal of the last shift register unit;

a signal input terminal of the first shift register unit inputs a frame start signal;

the first clock signal input terminal of the odd-numbered shift register unit inputs the first clock signal, the second clock signal input terminal of the odd-numbered shift register unit inputs the second clock signal; the first clock signal input terminal of the even-numbered shift register unit inputs the second clock signal, the second clock signal input terminal of the even-numbered shift register unit inputs the first clock signal;

the low voltage signal input terminal of each shift register unit inputs a low voltage signal.

In the shift register unit and the gate drive device for liquid crystal display provided in the embodiment of the present invention, the drain and the gate of the ninth thin film transistor and the drain of the seventh thin film transistor are connected to the second clock signal input terminal, during the period that the gate drive signal is at high level, the leakage current would not be generated among the seventh thin film transistor, the eighth thin film transistor, the ninth thin film transistor and the tenth thin film transistor, thus the power consumption of the shift register unit may be reduced, thereby reducing the power consumption of the liquid crystal display utilizing the shift register unit.

A further detailed description of the technical solutions of the embodiments of the present invention is made below in connection with drawings and embodiments.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b illustrates a timing chart of shift register unit of FIG. 1a;

FIG. 2b illustrates a timing chart of shift register unit of FIG. 2a;

FIG. 3b illustrates a timing chart of shift register unit of FIG. 3a;

FIG. 6b illustrates a timing chart of the input and output of the gate drive device for the liquid crystal display of FIG. 6a.

DETAILED DESCRIPTION

Figure 2A:
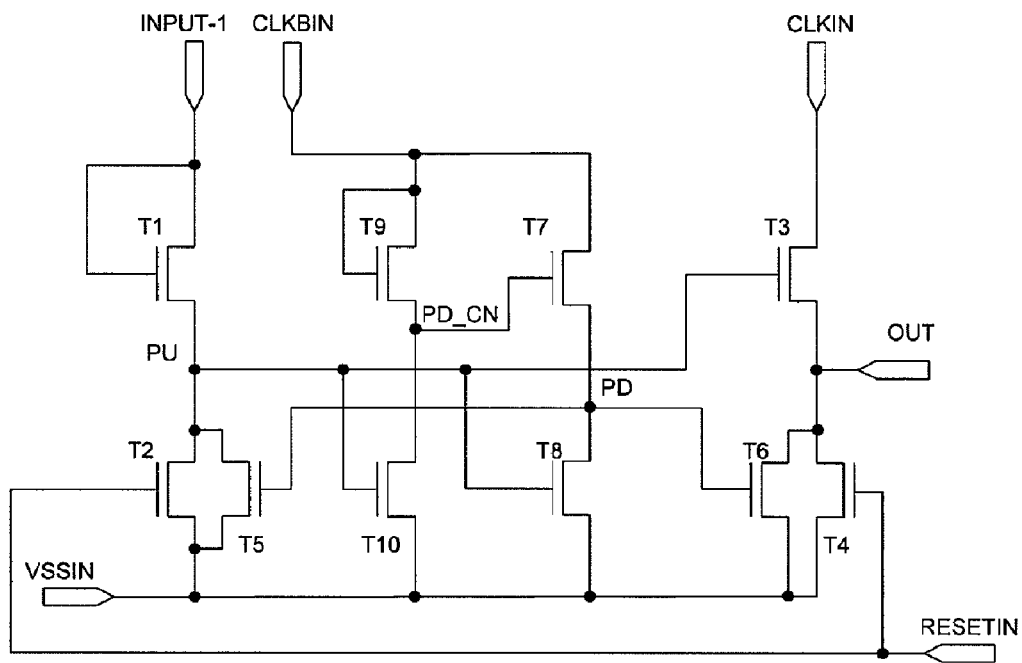
FIG. 2a illustrates a schematic diagram of a structure of the shift register unit according to an embodiment of the present invention.

FIG. 2a illustrates a schematic diagram of a structure of the shift register unit according to an embodiment of the present invention, the shift register unit comprises 10 thin film transistors, wherein the gate and the drain of the first thin film transistor T1 are both connected to the signal input terminal (INPUT-1), the drain of the second thin film transistor T2 is connected to the source of the first thin film transistor T1, the gate of the second thin film transistor T2 is connected to the reset signal input terminal(RESETIN), the source of the second thin film transistor T2 is connected to the low voltage signal input terminal(VSSIN); the drain of the third thin film transistor T3 is connected to the first clock signal input terminal(CLKIN), the gate of the third thin film transistor T3 is connected to the source of the first thin film transistor T1, the source of the third thin film transistor T3 is connected to signal output terminal (OUT); the gate of the fourth thin film transistor T4 is connected to the reset signal input terminal (RESETIN), the drain of the fourth thin film transistor T4 is connected to the source of the third thin film transistor T3, the source of the fourth thin film transistor T4 is connected to the low voltage signal input terminal(VSSIN); the drain of the fifth thin film transistor T5 is connected to the source of the first thin film transistor T1, the source of the fifth thin film transistor T5 is connected to the low voltage signal input terminal(VSSIN); the drain of the sixth thin film transistor T6 is connected to the source of the third thin film transistor T3, the source of the sixth thin film transistor T6 is connected to the low voltage signal input terminal(VSSIN); the drain of the seventh thin film transistor T7 is connected to the second clock signal input terminal(CLKBIN), the source of the seventh thin film transistor T7 is connected to the gate of the fifth thin film transistor T5 and the gate of the sixth thin film transistor T6, respectively; the gate of the eighth thin film transistor T8 is connected to the source of the first thin film transistor T1, the drain of the eighth thin film transistor T8 is connected to the source of the seventh thin film transistor T7, the source of the eighth thin film transistor T8 is connected to the low voltage signal input terminal(VSSIN); both the gate and the drain of the ninth thin film transistor T9 are connected to the second clock signal input terminal(CLKBIN), the source of the ninth thin film transistor T9 is connected to the gate of seventh thin film transistor T7; the gate of the tenth thin film transistor T10 is connected to the source of the first thin film transistor T1, the drain of the tenth thin film transistor T10 is connected to the source of the ninth thin film transistor T9, the source of the tenth thin film transistor T10 is connected to the low voltage signal input terminal(VSSIN). The convergence point for the source of the first thin film transistor T1, the drain of the second thin film transistor T2, the drain of the fifth thin film transistor T5, the gate of the tenth thin film transistor T10, the gate of eighth thin film transistor T8 and the gate of the third thin film transistor T3 is PU node, the convergence point for the source of the seventh thin film transistor T7, the drain of the eighth thin film transistor T8, the gate of the fifth thin film transistor T5 and the gate of the sixth thin film transistor T6 is PD node, the convergence point for the source of the ninth thin film transistor T9, the drain of the tenth thin film transistor T10 and the gate of the seventh thin film transistor T7 is PD_CN node.

Figure 1A:
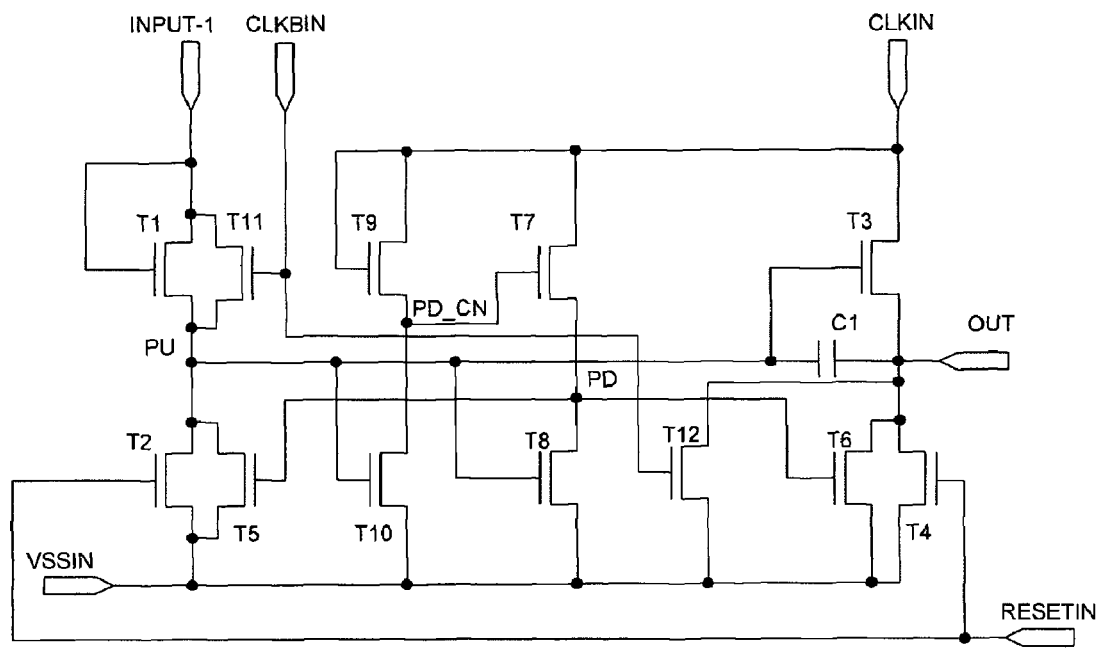
FIG. 1a illustrates a schematic diagram of a structure of the shift register unit in the prior art.

The structural difference between the shift register unit provided in the embodiments of the present invention and the shift register unit shown in FIG. 1a lies in that: in the shift register unit of the embodiments of the present invention, the gate and the drain of the ninth thin film transistor T9 and the drain of the seventh thin film transistor T7 are connected to the second clock signal input terminal(CLKBIN), while in FIG. 1a, the gate and the drain of the ninth thin film transistor T9 and the drain of the seventh thin film transistor T7 are connected to the first clock signal input terminal(CLKIN); further, the eleventh thin film transistor T11, the twelfth thin film transistor T12 and the capacitor C1 are omitted from the shift register unit provided in the embodiments of the present invention.

Figure 2B:
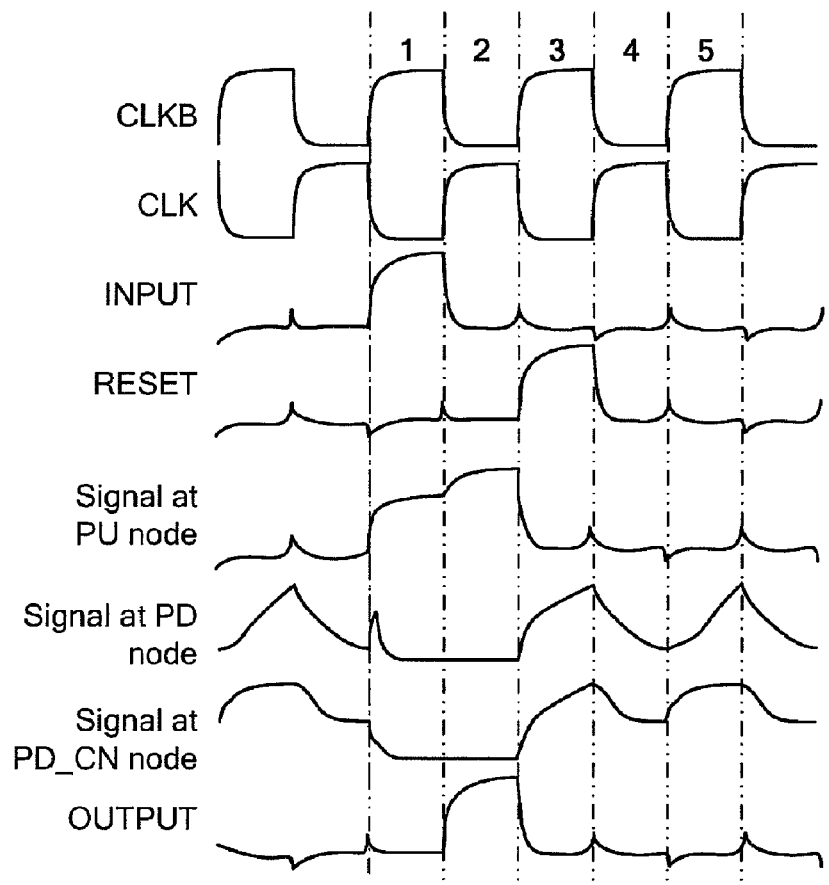

FIG. 2b illustrates a timing chart of shift register unit of FIG. 2a, in FIG. 2a, a signal input terminal(INPUT-1) inputs a signal(INPUT), a first clock signal input terminal(CLKIN) inputs a first clock signal(CLK), a second clock signal input terminal(CLKBIN) inputs a second clock signal(CLKB), a low voltage signal input terminal(VSSIN) inputs a low voltage signal(VSS), a reset signal input terminal(RESETIN) inputs a reset signal(RESET), and a signal output terminal (OUT) outputs a gate drive signal(OUTPUT). FIG. 2b does not show the low voltage signal(VSS), which is a signal maintaining at low level all the time.

The operation principle of the shift register unit of the embodiments of the present invention is illustrated below in connection with FIG. 2a and FIG. 2b.

A part of the timing chart shown in FIG. 2b is selected and divided into five stages. In the first stage, the signal(INPUT) inputted from the signal input terminal(INPUT-1) is at high level, the reset signal(RESET) inputted from the reset signal input terminal(RESETIN) is at low level, the first thin film transistor T1 is turned on, the signal at the PU node is at high level, the third thin film transistor T3, the eighth thin film transistor T8 and the tenth thin film transistor T10 are turned on; the first clock signal(CLK) inputted from the first clock signal input terminal(CLKIN) is at low level, the second clock signal(CLKB) inputted from the second clock signal input terminal(CLKBIN) is at high level, the seventh thin film transistor T7 and the ninth thin film transistor T9 are turned on. It is possible to make the signal at PD node is at low level by setting the ratio between the width-length ratio of the channel of the seventh thin film transistor T7 and that of the eighth thin film transistor T8, and setting the ratio between the width-length ratio of the channel of the ninth thin film transistor T9 and that of the tenth thin film transistor T10, therefore the fifth thin film transistor T5 and the sixth thin film transistor T6 are turned off, wherein the ratio between the width-length ratio of the channel of the seventh thin film transistor T7 and that of the eighth thin film transistor T8 may be 1/1~1/50, e.g., 1/5; the ratio between the width-length ratio of the channel of the ninth thin film transistor T9 and that of the tenth thin film transistor T10 may be 1/1~1/50, e.g., 1/5; the reset signal(RESET) inputted from the reset signal input terminal(RESETIN) is at low level, the second thin film transistor T2 and the fourth thin film transistor T4 are turned off, the gate drive signal(OUTPUT) outputted from the signal output terminal (OUT) is at low level.

In the second stage, the signal(INPUT) inputted from the signal input terminal(INPUT-1) is at low level, the reset signal (RESET) inputted from the reset signal input terminal(RESETIN) is at low level, the first thin film transistor T1 is turned off, the signal at PU node maintains at high level, thus the third thin film transistor T3, the eighth thin film transistor T8 and the tenth thin film transistor T10 maintain on; the second clock signal(CLKB) inputted from the second clock signal input terminal(CLKBIN) is at low level, the ninth thin film transistor T9 is turned off, the signal at PD node maintains at low level, the fifth thin film transistor T5 and the sixth thin film transistor T6 maintain off; the reset signal(RESET) inputted from the reset signal input terminal(RESETIN) is at low level, the second thin film transistor T2 and the fourth thin film transistor T4 maintain off; the first clock signal(CLK) inputted from the first clock signal input terminal(CLKIN) is at high level, and the third thin film transistor T3 maintains turned on, therefore the gate drive signal(OUTPUT) outputted from the signal output terminal (OUT) is at high level.

In the third stage, the signal(INPUT) inputted from the signal input terminal(INPUT-1) is at low level, the reset signal (RESET) inputted from the reset signal input terminal(RESETIN) is at high level, the second thin film transistor T2 and the fourth thin film transistor T4 are turned on, the source of the second thin film transistor T2 is connected to the low voltage signal input terminal(VSSIN), thus the PU node is pulled down to low level, the third thin film transistor T3, the eighth thin film transistor T8 and the tenth thin film transistor T10 are turned off; the second clock signal(CLKB) inputted from the second clock signal input terminal(CLKBIN) is at high level, the seventh thin film transistor T7 and the ninth thin film transistor T9 are turned on, the PD node is at high level, the PD_CN node is at high level, therefore the fifth thin film transistor T5 and the sixth thin film transistor T6 are turned on; the first clock signal(CLK) inputted from the first clock signal input terminal(CLKIN) is at low level, and the fourth thin film transistor T4 is turned on, the gate drive signal(OUTPUT) outputted from the signal output terminal (OUT) is pulled down to low level.

In the fourth stage, the signal(INPUT) inputted from the signal input terminal(INPUT-1) is at low level, the reset signal (RESET) inputted from the reset signal input terminal(RESETIN) is at low level, the first thin film transistor T1 is turned off, the signal at PU node maintains at low level, the eighth thin film transistor T8 and the tenth thin film transistor T10 are turned off; the second clock signal(CLKB) inputted from the second clock signal input terminal(CLKBIN) is at low level, the ninth thin film transistor T9 is turned off; because the signal at PD_CN node in the third stage is at high level, in the fourth stage, the ninth thin film transistor T9 and the tenth thin film transistor T10 are turned off, the signal at PD_CN node maintains at high level, then the seventh thin film transistor T7 is turned on; the drain of the seventh thin film transistor T7 is connected to the second clock signal input terminal(CLKBIN), the second clock signal(CLKB) is at low level in the fourth stage, the signal at PD node is at high level in the third stage, so in the fourth stage, the signal at PD node is gradually lowered from high level to low level, the fifth thin film transistor T5 and the sixth thin film transistor T6 are gradually changed from turned on to turned off; the reset signal(RESET) inputted from the reset signal input terminal(RESETIN) is at low level, the second thin film transistor T2 and the fourth thin film transistor T4 are turned off, the gate drive signal(OUTPUT) outputted from the signal output terminal (OUT) maintains at low level.

In the fifth stage, the signal(INPUT) inputted from the signal input terminal(INPUT-1) is at low level, the reset signal (RESET) inputted from the reset signal input terminal(RESETIN) is at low level, the first thin film transistor T1 is turned off, the signal at PU node is at low level, the eighth thin film transistor T8 and the tenth thin film transistor T10 are turned off; the second clock signal(CLKB) inputted from the second clock signal input terminal(CLKBIN) is at high level, the seventh thin film transistor T7 and the ninth thin film transistor T9 are turned on, the signal at PD node is gradually increased from low level to high level, thus the fifth thin film transistor T5 and the sixth thin film transistor T6 are gradually changed from turned off to turned on; the reset signal(RESET) inputted from the reset signal input terminal(RESETIN) is at low level, the second thin film transistor T2 and the fourth thin film transistor T4 are turned off, the gate drive signal(OUTPUT) outputted from the signal output terminal (OUT) maintains at low level.

Among these five stages, in the first stage, the signal(INPUT) inputted from the signal input terminal(INPUT-1) is at high level, in the second stage, the gate drive signal(OUTPUT) outputted from the signal output terminal (OUT) is at high level, by which a shift is finished once; in the third stage, the reset signal(RESET) inputted from the reset signal input terminal(RESETIN) is at high level, by which the reset operation is finished, therefore the first, second and third stages may be defined as the operating time of the shift register unit, in the fourth and fifth stages, the signal(INPUT) inputted from the signal input terminal(INPUT-1) and the reset signal (RESET) inputted from the reset signal input terminal(RESETIN) are both at low level, therefore the fourth and fifth stages may be defined as the non-operating time of the shift register unit. FIG. 2b shows only part of the timing chart of the shift register unit, whenever the liquid crystal display displays one frame image, the shift register unit controlling a certain row the liquid crystal pixels will output a high level signal, the signal(INPUT) inputted from the signal input terminal(INPUT-1), the reset signal(RESET) inputted from the reset signal input terminal(RESETIN) and the first clock signal(CLK) inputted from the first clock signal input terminal(CLKIN) will all repeat once the input timing sequence of the first, second and third stages. During displaying one frame image in the liquid crystal display, in the time except for the first stage, the second stage and the third stage, the signal(INPUT) inputted from the signal input terminal(INPUT-1), the reset signal(RESET) inputted from the reset signal input terminal (RESETIN) and the first clock signal(CLK) inputted from the first clock signal input terminal(CLKIN) will all repeat the input timing sequence same as that of the fourth stage and the fifth stage.

As noted from the above detailed description of the five stages, in the second stage, the first clock signal (CLK) and the signal outputted from the PU node are high level at same time, however the ninth thin film transistor T9 is turned off since the gate of the ninth thin film transistor T9 is connected to the second clock signal input terminal(CLKBIN). The gate of the seventh thin film transistor T7 is connected to PD_CN node, while the signal at PD_CN node in the second stage is also low level, thus the seventh thin film transistor T7 is turned off. The eighth thin film transistor T8 and the tenth thin film transistor T10 are turned on in the second stage, the source of the eighth thin film transistor T8 and the source of the tenth thin film transistor T10 are both connected to low voltage signal input terminal(VSSIN), so the sources of eighth thin film transistor T8 and the tenth thin film transistor T10 are at low level. In the second stage, the second clock signal(CLKB) is at low level, such that the drain of the ninth thin film transistor T9 and the source of the tenth thin film transistor T10 are both at low level, therefore no leakage current will be generated in the ninth thin film transistor T9 and the tenth thin film transistor T10, the drain of the seventh thin film transistor T7 and the source of the eighth thin film transistor T8 are both low level, therefore no leakage current will be generated in the seventh thin film transistor T7 and the eighth thin film transistor T8.

Compared with the shift register unit of the prior art shown in FIG. 1a, in the shift register unit provided in the embodiments of the present invention, the drain of the seventh thin film transistor T7 and the drain and the gate of the ninth thin film transistor T9 are both connected to the second clock signal input terminal(CLKBIN), such that it can prevent the leakage current from being generated among the seventh thin film transistor T7, the eighth thin film transistor T8, the ninth thin film transistor T9 and the tenth thin film transistor T10 during the second stage, and reduce the power consumption of the shift register unit, thereby reducing the power consumption of liquid crystal display adopting the shift register unit. In addition, the shift register unit provided in the embodiments of the present invention enables a simple structure of the shift register unit and reduces the area of the shift register unit since it omits the eleventh thin film transistor T11, the twelfth thin film transistor T12 and the capacitor C1.

Figure 3A:
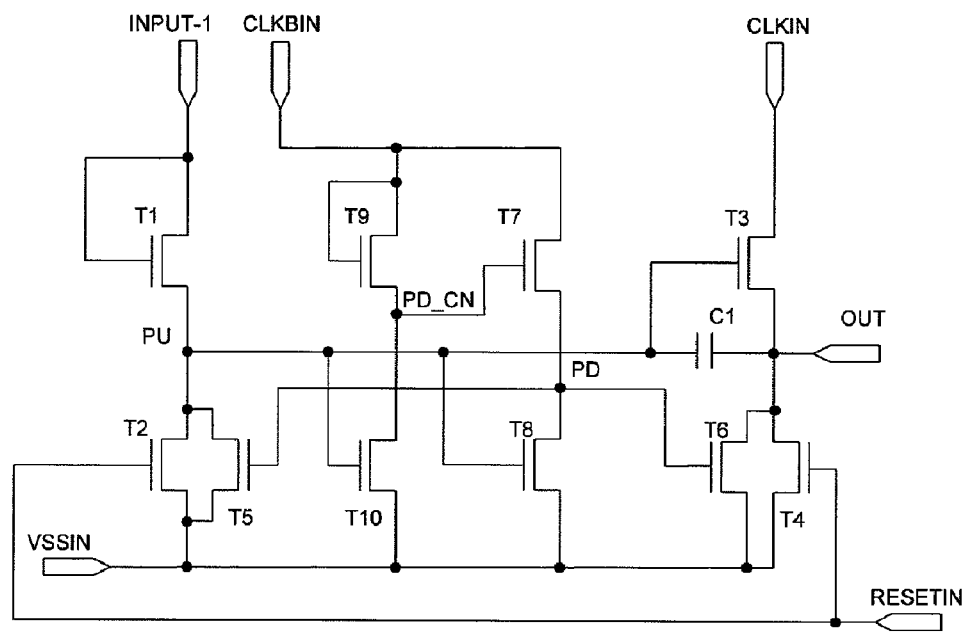
FIG. 3a illustrates a schematic diagram of a structure of the shift register unit according to a first embodiment of the present invention.
Figure 3B:
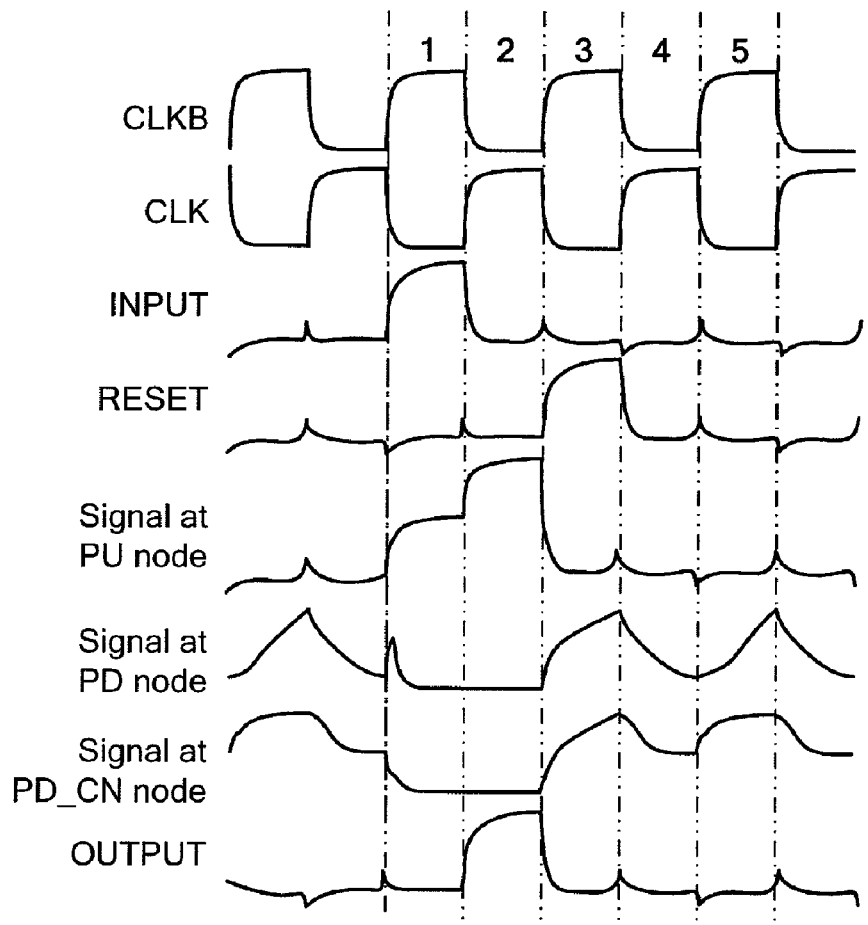

FIG. 3a illustrates a schematic diagram of a structure of the shift register unit according to a first embodiment of the present invention; FIG. 3b illustrates a timing chart of shift register unit of FIG. 3a. The shift register unit shown in FIG. 3a adds a capacitor C1 on the basis of the shift register unit shown in FIG. 2a, the two ends of the capacitor C1 are connected to the gate of the third thin film transistor T3 and the signal output terminal(OUT) respectively. The difference between the timing chart shown in FIG. 3b and the timing chart shown in FIG. 2b is: in the second stage, the level of the signal at PU node in FIG. 3b is higher than that of FIG. 2b due to the coupling effect of capacitor C1.

In FIG. 3a, it can increase the ability of removing noise for the shift register unit by adding the capacitor C1, thereby increasing the operation stability of the shift register unit. In one hand, because C1 increases the total capacitance of PU node and reduces the proportion of the drain parasitic capacitance (Cgd3) of the third thin film transistor T3 in the PU node, as a result thereof, it can reduce the noise coupled to PU node from the first clock signal input terminal (CLKIN) through the parasitic capacitance (Cgd3), thus the coupled noise indirectly to the signal output terminal (OUT) will also be reduced, meanwhile, the leakage current of the third thin film transistor T3 is also reduced accordingly, and the noise in the signal output terminal (OUT) will be further reduced.

Figure 4:
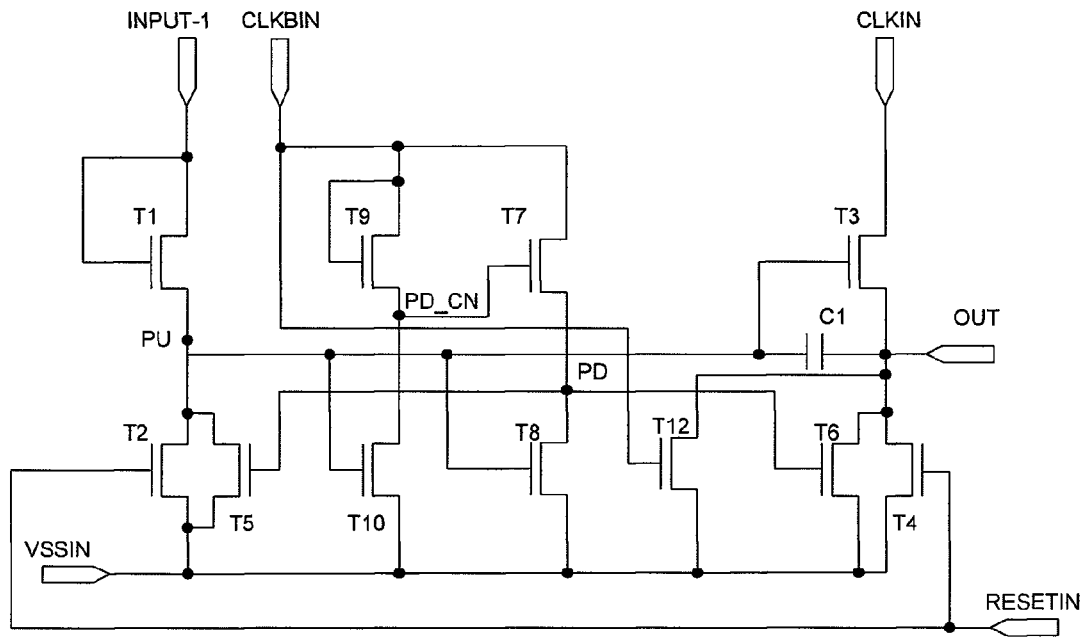
FIG. 4 illustrates a schematic diagram of a structure of the shift register unit according to a second embodiment of the present invention.

FIG. 4 illustrates a schematic diagram of a structure of the shift register unit according to a second embodiment of the present invention, the timing chart of the shift register unit shown in FIG. 4 is the same as FIG. 3b. This embodiment adds a twelfth thin film transistor T12 on the basis of the shift register unit shown in FIG. 3a. The source of the twelfth thin film transistor T12 is connected to the low voltage signal input terminal(VSSIN), the drain thereof is connected to the signal output terminal (OUT), the gate thereof is connected to the second clock signal input terminal(CLKBIN). When the second clock signal(CLKB) is at high level, the twelfth thin film transistor T12 can pull down the level of the gate drive signal (OUT) outputted from the signal output terminal (OUT), and further increase the ability of removing noise for the shift register unit.

Figure 5:
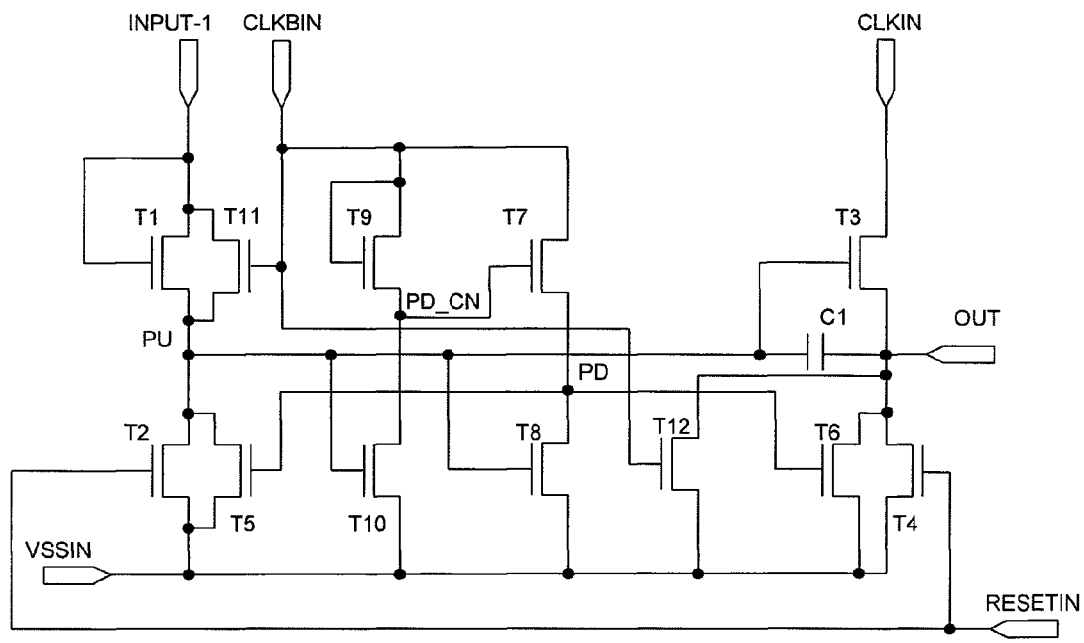
FIG. 5 illustrates a schematic diagram of a structure of the shift register unit according to a third embodiment of the present invention.

FIG. 5 illustrates a schematic diagram of a structure of the shift register unit according to a third embodiment of the present invention; the timing chart of the shift register unit shown in FIG. 5 is same as that in FIG. 3b. This embodiment adds an eleventh thin film transistor T11 on the basis of the shift register unit shown in FIG. 4. The gate of the eleventh thin film transistor T11 is connected to the second clock signal input terminal(CLKBIN), the drain thereof is connected to the signal input terminal (INPUT-1), the source thereof is connected to PU node. In this embodiment, during the first stage, when the second clock signal(CLKB) is at high level, the eleventh thin film transistor T11 is turned on, and because the signal(INPUT) inputted from the signal input terminal(INPUT-1) is at high level, the source of the eleventh thin film transistor T11 is at high level, the addition of the eleventh thin film transistor T11 can reduce the rising time of the level of the signal outputted from PU node, which makes the rising edge of the signal at PU node becomes steep, thus the rising time of the gate drive signal outputted from the signal output terminal (OUT) is reduced.

Figure 1B:
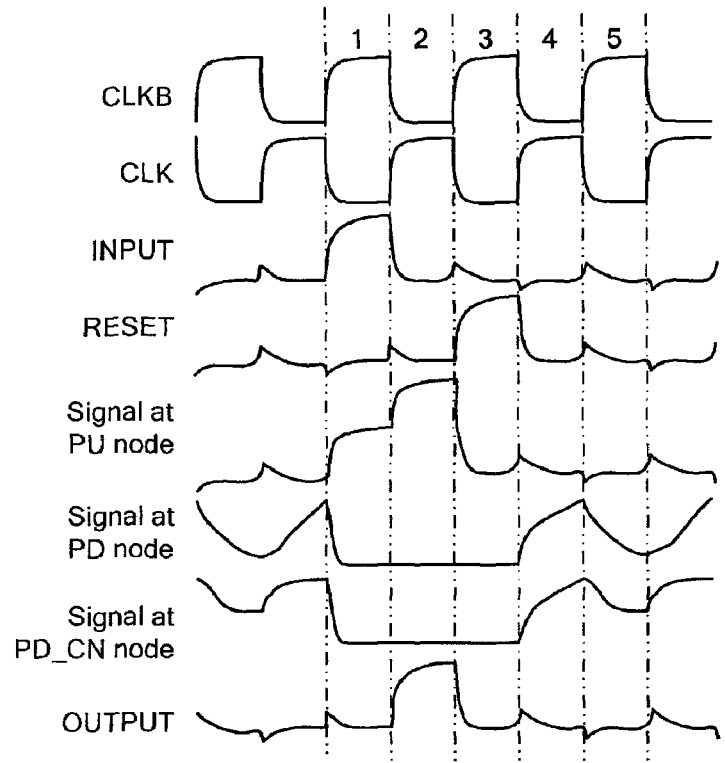

Comparing the shift register unit shown in FIG. 5 and the timing chart of the shift register unit shown in FIG. 5 with FIG. 1a and FIG. 1b respectively, it can be seen that, for the shift register unit shown in FIG. 1a and the timing chart shown in FIG. 1b, in the fourth stage, in the rising edge of the first clock signal (CLK), the coupled noise from the first clock signal (CLK) coupling to the gate drive signal (OUTPUT) is maximum, at this time, the PD node is at low level, the sixth thin film transistor and the fifth thin film transistor are both turned off, which can not pull down the gate drive signal (OUTPUT) to low level and is not helpful for removing the noise. In the embodiment shown in FIG. 5, in the fourth stage, in the rising edge of the first clock signal (CLK), the signal at PD node is at high level, the fifth thin film transistor and the sixth thin film transistor are both turned on, which can pull down the voltage of the gate drive signal (OUTPUT), and remove the noise caused by the first clock signal (CLK) coupling.

Figure 6A:
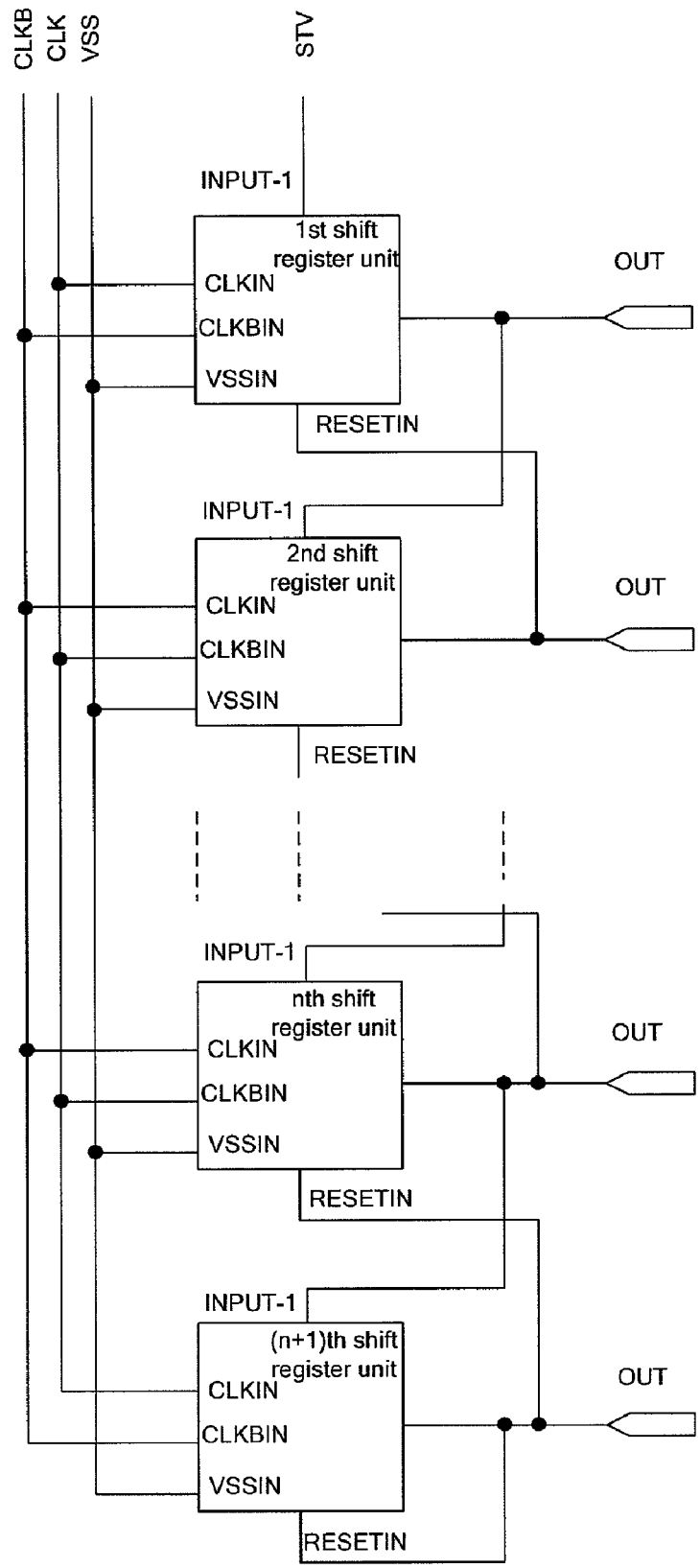
FIG. 6a illustrates a schematic diagram of a structure of the gate drive device for the liquid crystal display according to the embodiments of the present invention.
Figure 6B:
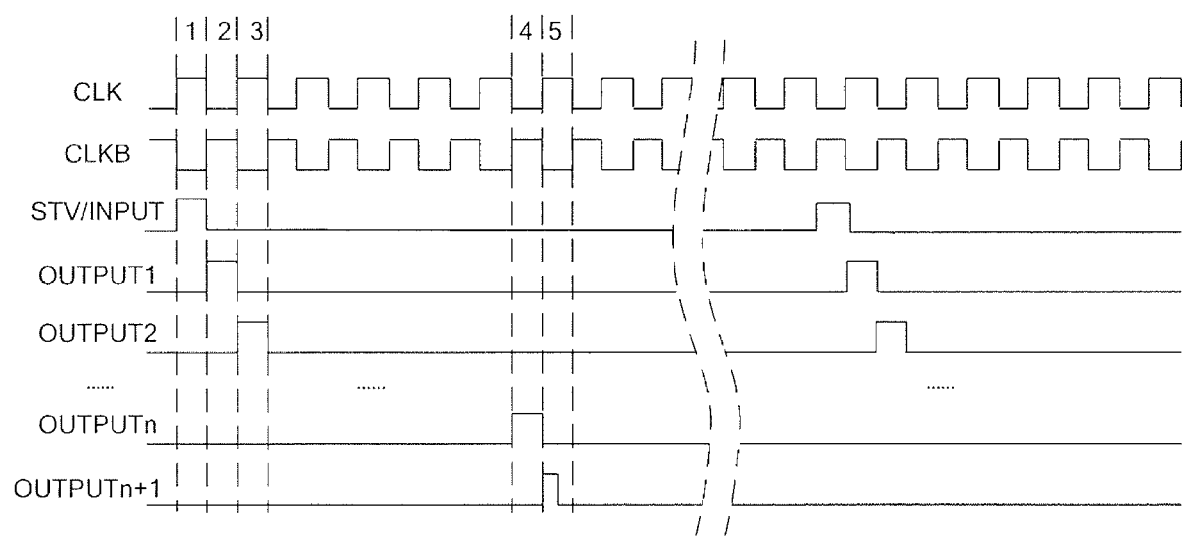

FIG. 6a illustrates a schematic diagram of a structure of the gate drive device for the liquid crystal display according to the present invention; FIG. 6b illustrates a timing chart of the input and output of the gate drive device for the liquid crystal display of FIG. 6a. STV is a frame start signal, which is only inputted to the signal input terminal (INPUT-1) of the first shift register unit, a low voltage signal (VSS, not shown in FIG. 6b) is inputted to the low voltage signal input terminal (VSSIN) of each shift register unit, the first clock signal input terminal(CLKIN) of the odd-numbered shift register unit inputs a first clock signal(CLK), the second clock signal input terminal(CLKBIN) thereof inputs a second clock signal (CLKB); the first clock signal input terminal(CLKIN) of the even-numbered shift register unit inputs a second clock signal (CLKB), the second clock signal input terminal(CLKBIN) thereof inputs a first clock signal (CLK). Except for the first shift register unit and the last shift register unit, the signal output terminal of each shift register unit is connected to the reset signal input terminal(RESETIN) of previous adjacent shift register unit and the signal input terminal(INPUT-1) of the next adjacent shift register unit, the signal output terminal (OUT) of the first shift register unit is only connected to the signal input terminal(INPUT-1) of the second shift register unit, the output terminal (OUT) of the last shift register unit (e.g. the (n+1)th shift register unit shown in FIG. 6a) is connected to the reset signal input terminal(RESETIN) of the adjacent nth shift register unit and the reset signal input terminal(RESETIN) of itself, respectively.

The liquid crystal display with thin film transistor adopts a scan manner of row by row, the gates of thin film transistors connected in series with the liquid crystal pixels in the same row are all connected to the same shift register unit, the shift register unit of the gate drive device for liquid crystal display can control the on and off of all the thin film transistors in the same row. The principle of the gate drive device for liquid crystal display in FIG. 6a is that: assuming there are n rows of liquid crystal pixels in the panel of the liquid crystal display, with reference to the timing chart of FIG. 6b, in the first stage, the frame start signal is inputted to the signal input terminal (INPUT-1) of the first shift register unit; in the second stage, the signal output terminal (OUT) of the first shift register unit outputs a high level signal (OUTPUT1), which is inputted to the signal input terminal(INPUT-1) of the second shift register unit at same time; in the third stage, the signal output terminal (OUT) of the second shift register unit outputs a high level signal (OUTPUT2), thereafter each shift register unit sequentially outputs a high level signal, which is used to control the turned-on of the thin film transistors of the same row connected with the shift register unit, the principle is the same as that of the second and the third stage; in the fourth stage, the nth shift register unit outputs a high level signal (OUTPUTn), meanwhile the high level signal (OUTPUTn) outputted from the nth shift register unit is used as the input signal of the signal input terminal(INPUT-1) of the (n+1)th shift register unit; in the fifth stage, the (n+1)th shift register unit outputs a high level signal (OUTPUTn+1), the high level signal (OUTPUTn+1) outputted from the (n+1)th shift register unit is not used to drive the load, that is, the (n+1)th shift register unit is not responsible for driving control the thin film transistors of one row of liquid crystal pixels, its outputted high level signal (OUTPUTn+1) is only used as the reset signals of the nth shift register unit and itself. The respective shift register unit of FIG. 6a may be the shift register units shown in FIG. 2a, FIG. 3a, FIG. 4 or FIG. 5.

In FIG. 6a, the last shift register unit, i.e. the (n+1)th shift register unit is not used to driving the load, which may be considered as a redundant shift register unit. The gate drive device of FIG. 6a includes only one redundant shift register unit, though in practice, it may include more number of the redundant shift register units, each shift register unit may be combined to guarantee the gate drive device for liquid crystal display being reset more reliably.

In the shift register unit and the gate drive device for liquid crystal display provided in the embodiment of the present invention, the drain and the gate of the ninth thin film transistor and the drain of the seventh thin film transistor are connected to the second clock signal input terminal(CLKBIN), during the period that the gate drive signal (OUTPUT) is at high level, the leakage current would not be generated among the seventh thin film transistor, the eighth thin film transistor, the ninth thin film transistor and the tenth thin film transistor, thus the power consumption of the shift register unit may be reduced, thereby reducing the power consumption of the liquid crystal display utilizing the shift register unit.

Finally, it should be noted that, the above embodiments are used only to explain the technical solution of the embodiments of the present invention, not to limit the invention; although the embodiments of the present invention have been described in details with reference to the preferred embodiments thereof, it would be obvious to those skilled in the art that he can still make variations or equal replacement to the technical solutions of the embodiments of the present invention, such variations or equal replacements are not to be regarded as rending the nature of the amended technical solutions departing from the spirit and scope of the invention.

What is claimed is:

1. A shift register unit, comprising:
   a first thin film transistor, a drain and a gate of which are both connected to a signal input terminal;
   a second thin film transistor, a drain of which is connected to the source of the first thin film transistor, a gate of which is connected to a reset signal input terminal, and a source of which is connected to a low voltage signal input terminal;
   a third thin film transistor, a drain of which is connected to a first clock signal input terminal, a gate of which is connected to the source of the first thin film transistor, and a source of which is connected to a signal output terminal;
   a fourth thin film transistor, a drain of which is connected to the source of the third thin film transistor, a gate of which is connected to the reset signal input terminal, and a source of which is connected to the low voltage signal input terminal;
   a fifth thin film transistor, a drain of which is connected to the source of the first thin film transistor, and a source of which is connected to the low voltage signal input terminal;
   a sixth thin film transistor, a drain of which is connected to the source of the third thin film transistor, and a source of which is connected to the low voltage signal input terminal;
   a seventh thin film transistor, a drain of which is connected to a second clock signal input terminal, and a source of which is connected to the gate of the fifth thin film transistor and the gate of the sixth thin film transistor respectively;
   a eighth thin film transistor, a drain of which is connected to the source of the seventh thin film transistor, a gate of which is connected to the source of the first thin film transistor, and a source of which is connected to the low voltage signal input terminal;
   a ninth thin film transistor, a drain and a gate of which are both connected to the second clock signal input terminal, and a source of which is connected to the gate of the seventh thin film transistor;
   a tenth thin film transistor, a drain of which is connected to the source of the ninth thin film transistor, a gate of which is connected to the source of the first thin film transistor, and a source of which is connected to the low voltage signal input terminal;

a capacitor, two ends of which are connected to the gate of the third thin film transistor and the signal output terminal, respectively; and a twelfth thin film transistor, a drain of which is connected to the signal output terminal, a source of which is connected to the low voltage signal input terminal, and a gate of which is connected to the second clock signal input terminal.

2. The shift register unit as claimed in claim 1, further comprising an eleventh thin film transistor, a drain of which is connected to the signal input terminal, a gate of which is connected to the second clock signal input terminal, and a source of which is connected to the source of the first thin film transistor.

3. The shift register unit as claimed according to claim 1, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

4. The shift register unit as claimed according to claim 1, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

5. The shift register unit as claimed according to claim 1, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

6. The shift register unit as claimed according to claim 2, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

7. A gate drive device for liquid crystal display, comprising a plurality of shift register units as claimed according to claim 1, deposited on an array substrate of the liquid crystal display;

wherein except for the first shift register unit and the last shift register unit, the signal output terminal of each shift register unit is connected to the signal input terminal of a next adjacent shift register unit and the reset signal input terminal of a previous adjacent shift register unit, the signal output terminal of the first shift register unit is connected to the signal input terminal of the second shift register unit, the signal output terminal of the last shift register unit is connected to the reset signal input terminal of a previous adjacent shift register unit and the reset signal input terminal of the last shift register unit;

a signal input terminal of the first shift register unit inputs a frame start signal;

the first clock signal input terminal of the odd-numbered shift register unit inputs the first clock signal, the second clock signal input terminal of the odd-numbered shift register unit inputs the second clock signal; the first clock signal input terminal of the even-numbered shift register unit inputs the second clock signal, the second clock signal input terminal of the even-numbered shift register unit inputs the first clock signal;

the low voltage signal input terminal of each shift register unit inputs a low voltage signal.

8. The gate drive device for liquid crystal display as claimed in claim 7, wherein the shift register unit further comprising an eleventh thin film transistor, a drain of which is connected to the signal input terminal, a gate of which is connected to the second clock signal input terminal, and a source of which is connected to the source of the first thin film transistor.

9. The gate drive device for liquid crystal display as claimed according to claim 7, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

10. The gate drive device for liquid crystal display as claimed according to claim 7, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

11. The gate drive device for liquid crystal display as claimed according to claim 7, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

12. The gate drive device for liquid crystal display as claimed according to claim 8, wherein a ratio between a width-length ratio of the channel of the seventh thin film transistor and that of the eighth thin film transistor is 1/1~1/50; and a ratio between the width-length ratio of the channel of the ninth thin film transistor and that of the tenth thin film transistor is 1/1~1/50.

* * * * *